US012456700B2

(12) United States Patent
Bonart et al.

(10) Patent No.: US 12,456,700 B2
(45) Date of Patent: Oct. 28, 2025

(54) SEMICONDUCTOR DIE HAVING AN OPTICAL DETECTION MARKER AND METHOD OF PRODUCING THE SEMICONDUCTOR DIE

(71) Applicant: Infineon Technologies AG, Neubiberg (DE)

(72) Inventors: Dietrich Bonart, Bad Abbach (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 595 days.

(21) Appl. No.: 17/962,131

(22) Filed: Oct. 7, 2022

(65) Prior Publication Data
US 2024/0120298 A1   Apr. 11, 2024

(51) Int. Cl.
*H01L 23/544* (2006.01)
*H01L 23/00* (2006.01)

(52) U.S. Cl.
CPC ............ *H01L 24/05* (2013.01); *H01L 23/544* (2013.01); *H01L 24/03* (2013.01); *H01L 24/06* (2013.01); *H01L 2224/03001* (2013.01); *H01L 2224/0346* (2013.01); *H01L 2224/05018* (2013.01); *H01L 2224/05027* (2013.01); *H01L 2224/05082* (2013.01); *H01L 2224/05166* (2013.01); *H01L 2224/05184* (2013.01); *H01L 2224/05186* (2013.01); *H01L 2224/05551* (2013.01); *H01L 2224/05554* (2013.01); *H01L 2224/05556* (2013.01); *H01L 2224/05566* (2013.01); *H01L 2224/05573* (2013.01); *H01L 2224/05582* (2013.01); *H01L 2224/05624* (2013.01); *H01L 2224/05638* (2013.01); *H01L 2224/05644* (2013.01); *H01L 2224/05647* (2013.01); *H01L 2224/05669* (2013.01); *H01L 2224/0603* (2013.01); *H01L 2224/06051* (2013.01); *H01L 2224/06515* (2013.01); *H01L 2924/01014* (2013.01); *H01L 2924/0132* (2013.01); *H01L 2924/0133* (2013.01); *H01L 2924/04941* (2013.01)

(58) Field of Classification Search
CPC ........ H01L 24/05; H01L 23/544; H01L 24/06
See application file for complete search history.

(56) References Cited

U.S. PATENT DOCUMENTS 8,766,284 B1 * 7/2014 Dutta ..................... H05K 1/144
  257/432
2014/0084482 A1 * 3/2014 Hu .......................... H01L 24/83
  257/773

* cited by examiner

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A semiconductor die includes: a semiconductor substrate; a first contact pad structure above the semiconductor substrate, the first contact pad structure including a metal contact pad configured for electrical contact and a metal layer adjoining an underside of the metal contact pad and jutting out beyond an edge of the metal contact pad; and a first optical detection marker in a periphery of the first contact pad structure and having a different contrast than the metal contact pad. The first optical detection marker includes a region of the metal layer that is adjacent to the edge of the metal contact pad and unobstructed by the metal contact pad so as to be optically visible in a plan view of the semiconductor die. A method of producing the semiconductor die is also described.

20 Claims, 6 Drawing Sheets

SEMICONDUCTOR DIE HAVING AN OPTICAL DETECTION MARKER AND METHOD OF PRODUCING THE SEMICONDUCTOR DIE

BACKGROUND

Many types of semiconductor dies have highly reflective bond pads such as gold (Au) plated bond pads and high metallization density of buried metal layers around the bond pads, making it difficult to optically distinguish the bond pads from the underlying metallization during later processes such as alignment, testing, bonding, etc.

Thus, there is a need for an improved bond pad design that aids optical detection of bond pads.

SUMMARY

According to an embodiment of a semiconductor die, the semiconductor die comprises: a semiconductor substrate; a first contact pad structure above the semiconductor substrate, the first contact pad structure comprising a metal contact pad configured for electrical contact and a metal layer adjoining an underside of the metal contact pad and jutting out beyond an edge of the metal contact pad; and a first optical detection marker in a periphery of the first contact pad structure and having a different contrast than the metal contact pad, wherein the first optical detection marker comprises a region of the metal layer that is adjacent to the edge of the metal contact pad and unobstructed by the metal contact pad so as to be optically visible in a plan view of the semiconductor die.

According to another embodiment of a semiconductor die, the semiconductor die comprises: a semiconductor substrate; an interlayer dielectric above the semiconductor substrate; a patterned metallization in the interlayer dielectric; a passivation covering the interlayer dielectric and the patterned metallization; a first contact pad structure on the passivation and extending through a first opening in the passivation to contact a first part of the patterned metallization, the first contact pad structure comprising a first bond pad metallization that has a first contact area and a first barrier metallization below the first bond pad metallization, the first barrier metallization having a different contrast than the first bond pad metallization; and a first groove extending through the first bond pad metallization outside the first contact area and exposing the first barrier metallization from the first bond pad metallization.

According to an embodiment of a method of producing a semiconductor die, the method comprises: forming a patterned metallization in an interlayer dielectric above a semiconductor substrate; covering the interlayer dielectric and the patterned metallization with a passivation; forming a contact pad structure on the passivation and extending through an opening in the passivation to contact a first part of the patterned metallization, the contact pad structure comprising a bond pad metallization that has a contact area and a barrier metallization below the bond pad metallization, the barrier metallization having a different contrast than the bond pad metallization; and forming a groove that extends through the bond pad metallization outside the contact area and exposes the barrier metallization from the bond pad metallization.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of an optical detection marker for contact pads of a semiconductor die. The optical detection marker is defined, e.g., by a groove that extends through the bond pad metallization of a contact pad structure outside a contact area of the contact pad structure, to expose an underlying layer of the contact pad structure such as a barrier metallization, passivation, imide, etc. from the overlying bond pad metallization. The underlying layer has a different contrast than the bond pad metallization such that the exposed part of the underlying layer is optically visible in a plan view of the semiconductor die, thus easing pad recognition via optical inspection techniques.

Described next, with reference to the figures, are exemplary embodiments of the optical detection marker and methods of producing the optical detection marker. The optical detection marker features illustrated in the figures may be combined with one another unless such combination is inoperative.

Figure 1:
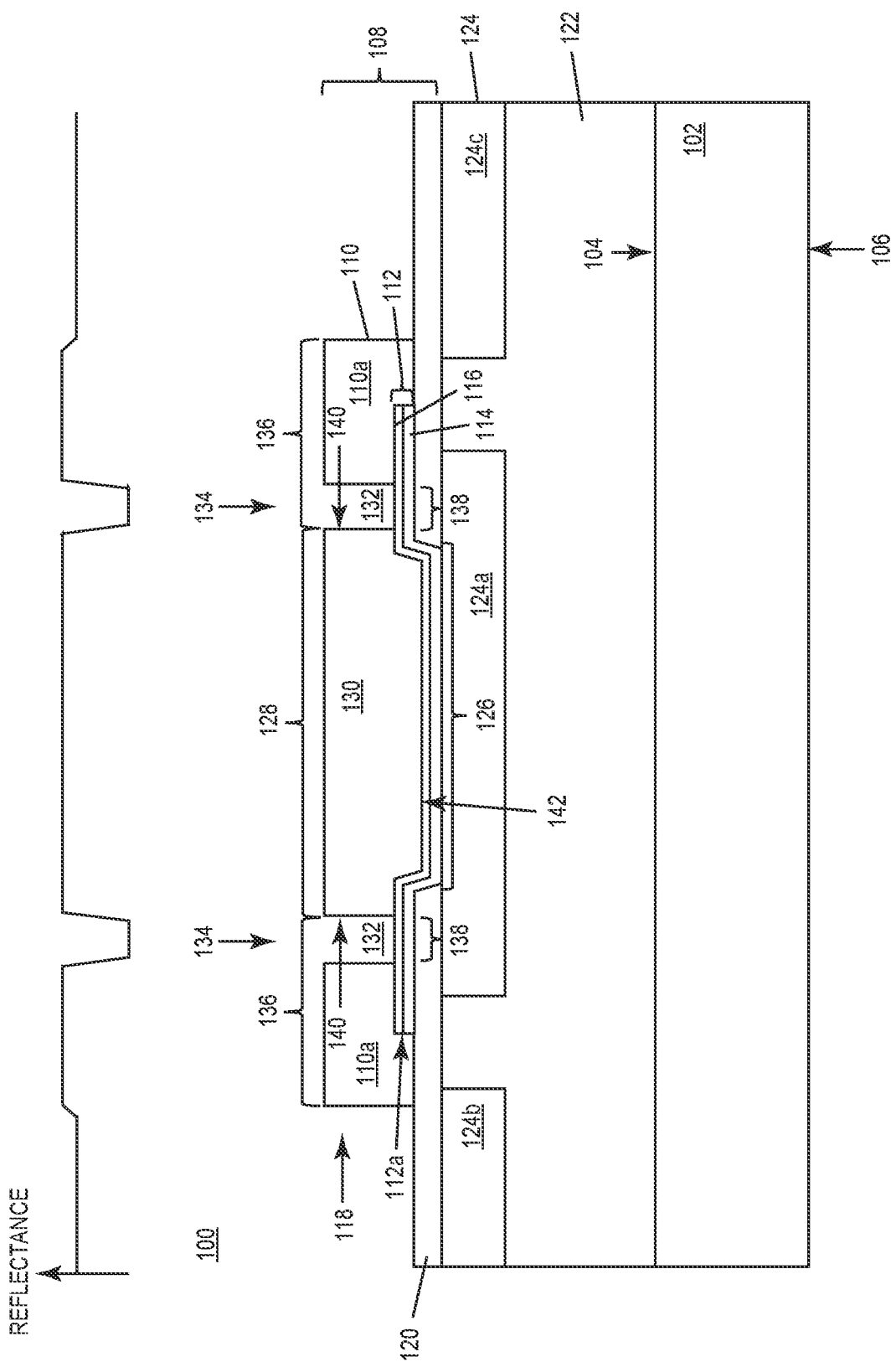
FIG. 1 illustrates a cross-sectional view of part of a semiconductor die having a contact pad structure with an optical detection marker.

FIG. 1 illustrates a cross-sectional view of part of a semiconductor (chip) die 100. The semiconductor die 100 includes a semiconductor substrate 102. The semiconductor substrate 102 may comprise any type of semiconductor material such as Si, SiC, GaN, etc. The semiconductor substrate 102 may include a base semiconductor and one or more epitaxial layers grown on the base semiconductor. The semiconductor die 100 may include a single transistor cell or several transistor cells, for example, the semiconductor die 100 may include 10s, 100s, 1000s or more transistor cells formed in the semiconductor substrate 102 and that are electrically connected in parallel to form a power transistor. For example, the transistor cells may share a source or emitter connection, a drain or collector connection, and a gate connection. The resulting power transistor may be a vertical device in that the primary current flow direction is between the front and back surfaces 104, 106 of the semiconductor substrate 102. The power transistor instead may be a lateral device in that the primary current flow direction is along the front surface 104 of the semiconductor substrate 102. The power transistor may be a power MOSFET (metal-oxide-semiconductor field-effect transistor), an IGBT (insulated gate bipolar transistor), a HEMT (high-electron mobility transistor), etc. Other types of electronic devices may be formed in the semiconductor substrate 102 such as, e.g., power diodes, logic devices, memory devices, etc. Device details are omitted from FIG. 1 to emphasize the layers formed over the semiconductor substrate 102.

The layers formed over the semiconductor substrate 102 include a final metallization stack 108. The final metallization stack 108 is the uppermost wiring structure for the semiconductor die 100. The final metallization stack 108 includes, e.g., a bond pad metallization 110 and a metal layer 112 below the bond pad metallization 110. The metal layer 112 has a different contrast than the bond pad metallization 110 such that any part of the metal layer 112 unobstructed by the bond pad metallization 110 is optically visible in a plan view of the semiconductor die 100 and optically distinguishable from the bond pad metallization 110. The phrase 'optically visible' as used herein refers to electromagnetic radiation in the range of 380 nm to about 750 nm (i.e., visible light).

In one embodiment, the metal layer 112 has a lower reflectance than the bond pad metallization 110 as indicated in FIG. 1, where the lower reflectance region appears darker than the bond pad metallization 110 during optical inspection. For example, the bond pad metallization 110 may comprise Au (gold), e.g., Au plating on Al (aluminum), AlCu (aluminum copper), AlSiCu (aluminum silicon copper), Cu, etc. In one embodiment, the bond pad metallization 110 may be a stack of Ti/Pt/Au formed over TiN.

In the case of a barrier metallization as the metal layer 112, the metal layer 112 may comprise TiN (titanium nitride) in this example. The metal layer 112 may comprise, e.g., only a TiN barrier 114 or a TiN barrier 114 and a Ti (titanium) adhesion promoter 116 on the TiN barrier 114 for improving adhesion to the bond pad metallization 110. In another example, the bond pad metallization 110 may comprise Cu (copper). In the case of a barrier metallization as the metal layer 112, the metal layer 112 may comprise TiW (titanium tungsten) as a Cu barrier. Still other combinations of metals and/or metal alloys than what are described above may be used for the bond pad metallization 110 and the underlying metal layer 112 so long as the underlying metal layer 112 has a different contrast than the bond pad metallization 110.

The metal layer 112 underlying the bond pad metallization 110 and that has a different contrast than the bond pad metallization 110 may comprise one or more layers of metals and/or metal alloys, e.g., only TiN, TiN and Ti, TiW, etc. Accordingly, the metal layer 112 underlying the bond pad metallization 110 and that has a different contrast than the bond pad metallization 110 may be single- or multi-layered. The metal layer 112 underlying the bond pad metallization 110 and that has a different contrast than the bond pad metallization 110 may be an intermediary metal layer interposed between the bond pad metallization 110 and the corresponding barrier metallization.

While the layer 112 of the final metallization stack 108 that underlies the bond pad metallization 110 and has a different contrast than the bond pad metallization 110 is described herein as a metal layer, this layer 112 instead may be made of a non-metal material or materials having a different contrast than the bond pad metallization 110 such as passivation, imide, etc. The final metallization stack 108 may include a plurality of metallization layers to enhance electromigration robustness, increase adhesion, improve thermal stability, reduce sheet resistance, etc.

A contact pad structure 118 is formed from the bond pad metallization 110 and the underlying metal layer 112 of the final metallization stack 108. The contact pad structure 118 is formed on a passivation 120 such as an imide, nitride, oxide, etc. The passivation 120 covers both an interlayer dielectric (ILD) 122 and a patterned metallization 124 in the ILD 122. The ILD 122 is disposed above the semiconductor substrate 102. FIG. 1 shows the final metallization stack 108 and the patterned metallization 124 as the only wiring layers/structures formed over the semiconductor substrate 102. However, one or more additional wiring layers may be formed between the patterned metallization 124 and the semiconductor substrate 102 and separated from one another by an ILD 122. The lowermost ILD 122 provides separation from the overlying wiring layers/structures and the semiconductor substrate 102. Each ILD 122 may comprise a single insulating layer or two or more different insulating layers. For example, the ILD 122 shown in FIG. 1 may include a lower oxide layer such as TEOS (tetraethyl orthosilicate) and an upper glass layer such as BPSG (borophosphosilicate glass).

The contact pad structure 118 disposed above the uppermost ILD 122 extends through an opening 126 in the passivation 120 to contact a first part 124a of the patterned metallization 124 embedded in the ILD 122. Other similarly constructed contact pad structures which are out of view in FIG. 1 may contact other parts 124b, 124c of the patterned metallization 124 through respective openings in the passivation 120 which are also out of view in FIG. 1.

Each contact pad structure 118 has a respective contact area 128 of a metal contact pad 130 formed by the bond pad metallization 110. The contact area 128 of the metal contact pad 130 is configured for electrical contact such as bonding, testing, probing, soldering, sintering, etc. The metal contact pad 130 is delimited by a groove 132 that extends through the bond pad metallization 110 outside the contact area 128 and exposes the underlying metal layer 112 from the bond pad metallization 110. Laterally beyond (outward from) the groove 132, the bond pad metallization 110 may include a region 110a that covers the edge 112a of the underlying metal layer 112, e.g., to prevent corrosion at the edge 112a in the case of the metal layer 112 being a barrier metallization.

In FIG. 1, the groove 132 defines an optical detection marker 134 in a periphery 136 of the contact pad structure 118 that includes the bond pad metallization 110 and the underlying metal layer 112. The optical detection marker 134 includes a region 138 of the underlying metal layer 112 that is adjacent to the edge 140 of the metal contact pad 130 formed from the bond pad metallization 110 and unobstructed by the metal contact pad 130 so as to be optically visible in a plan view of the semiconductor die 100. As shown in FIG. 1, the underlying metal layer 112 may adjoin the underside 142 of the metal contact pad 130 and laterally jut out beyond (outward from) the edge 140 of the metal contact pad 130 such that the groove 132 exposes at least part 138 of the underlying metal layer 112 that laterally juts out beyond the contact pad edge 140.

In the case described above of the bond pad metallization 110 comprising Au (e.g., Au plating) and the underlying metal layer 112 being a barrier metallization that comprises at least TiN, the groove 132 exposes the TiN from the Au to define the optical detection marker 134.

In the case described above of the bond pad metallization 110 comprising Cu and the underlying metal layer 112 being a barrier metallization that comprises TiW or some other Cu barrier, the groove 132 exposes the Cu barrier (e.g., TiW) from the Cu to define the optical detection marker 134.

As explained above, the metal layer 112 underlying the bond pad metallization 110 may be a barrier metallization or an intermediary metal layer interposed between the bond pad metallization 110 and the barrier metallization, or may be made of a non-metal material. Also as explained above, other combinations of metals and/or metal alloys may be used for the bond pad metallization 110 and the underlying metal layer 112 such that the underlying metal layer 112 has a different contrast than the bond pad metallization 110. In each case, the groove 132 or similar structure formed in the contact pad structure 118 exposes part of the underlying metal layer 112 to define the optical detection marker 134.

Figure 2:
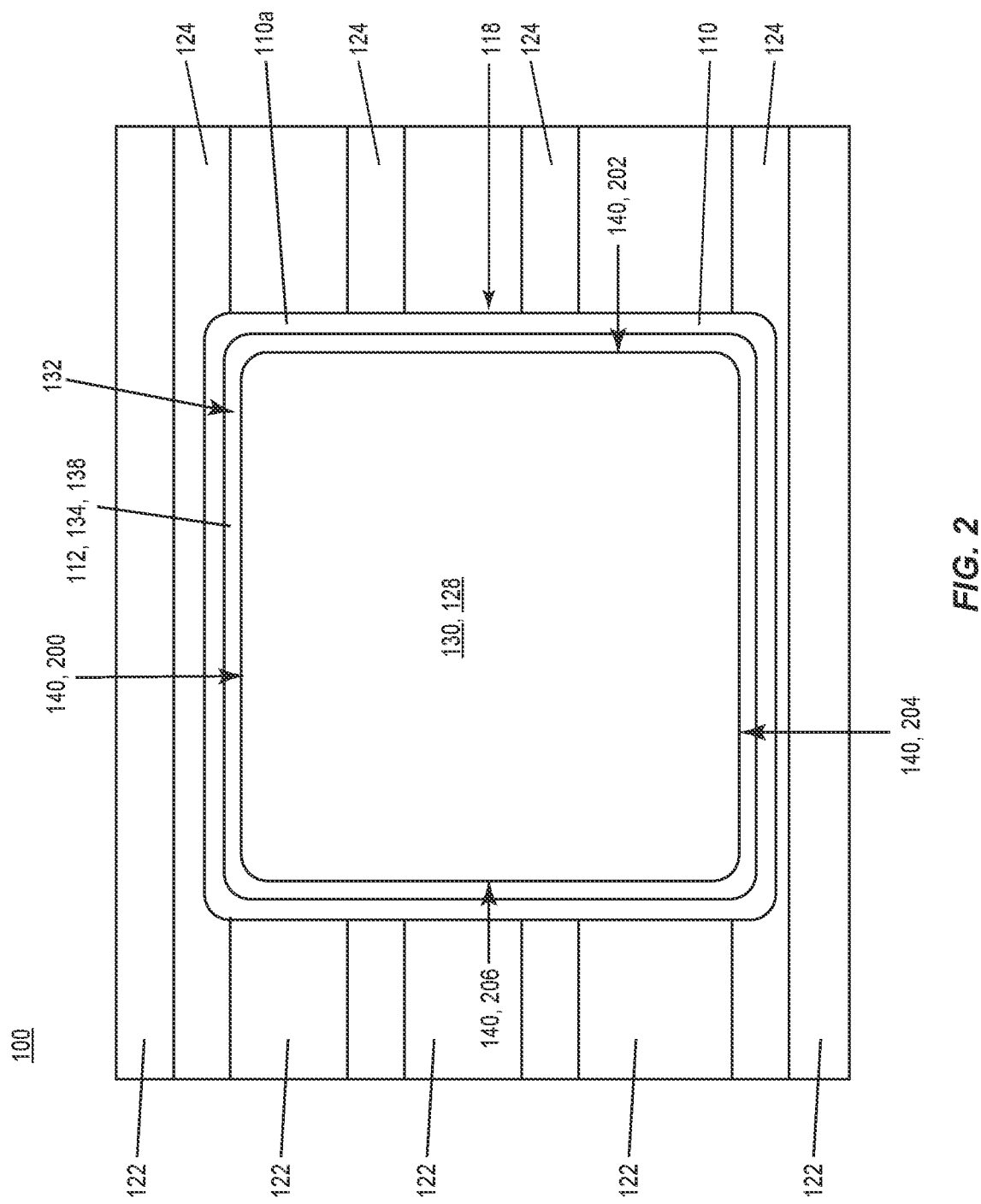
FIG. 2 illustrates a top plan view of the semiconductor die in a region of one contact pad structure.

FIG. 2 illustrates a top plan view of the semiconductor die 100 in a region of one contact pad structure 118. As explained above, the semiconductor die 100 may include a plurality of the contact pad structures 118 where the number of contact pad structures 118 depends on the type of electronic device formed in the semiconductor substrate 102 of the die 100.

The passivation 120 is not shown in FIG. 2 so that the ILD 122 and patterned metallization 124 below the final metallization stack 108 are visible. The bond pad metallization 110 of the final metallization stack 108 and the underlying patterned metallization 124 may have the same or similar reflectance, as indicated in FIG. 1. In this case, optical techniques for identifying the metal contact pad 130 of each contact pad structure 118 have difficulty distinguishing between the metal contact pad 130 and the underlying patterned metallization 124 because of the lack of contrast between these two metal structures. By providing the optical detection marker 134 in the periphery 136 of the contact pad structure 118, the contrast difference between the bond pad metallization 110 and the region 138 of the underlying metal layer 112 exposed by the groove 132 enables optical detection of the metal contact pad 130 despite the close proximity and density of the underlying patterned metallization 124.

In FIG. 2, the metal contact pad 130 with the contact area 128 has four sides 200, 202, 204, 206 that define the edge 140 of the metal contact pad 130/contact area 128. The groove 132 formed in the contact pad structure 118 exposes the underlying metal layer 112 from the bond pad metallization 110 along at least part of all four sides 200, 202, 204, 206 of the metal contact pad 130/contact area 128 such that the optical detection marker 134 is optically visible in the plan view of the semiconductor die 100. The embodiment illustrated in FIG. 2 shows the groove 132 exposing the underlying metal layer 112 from the bond pad metallization 110 along the entirety of all four sides 200, 202, 204, 206 of the metal contact pad 130/contact area 128. However, this is just an example.

Figure 3:
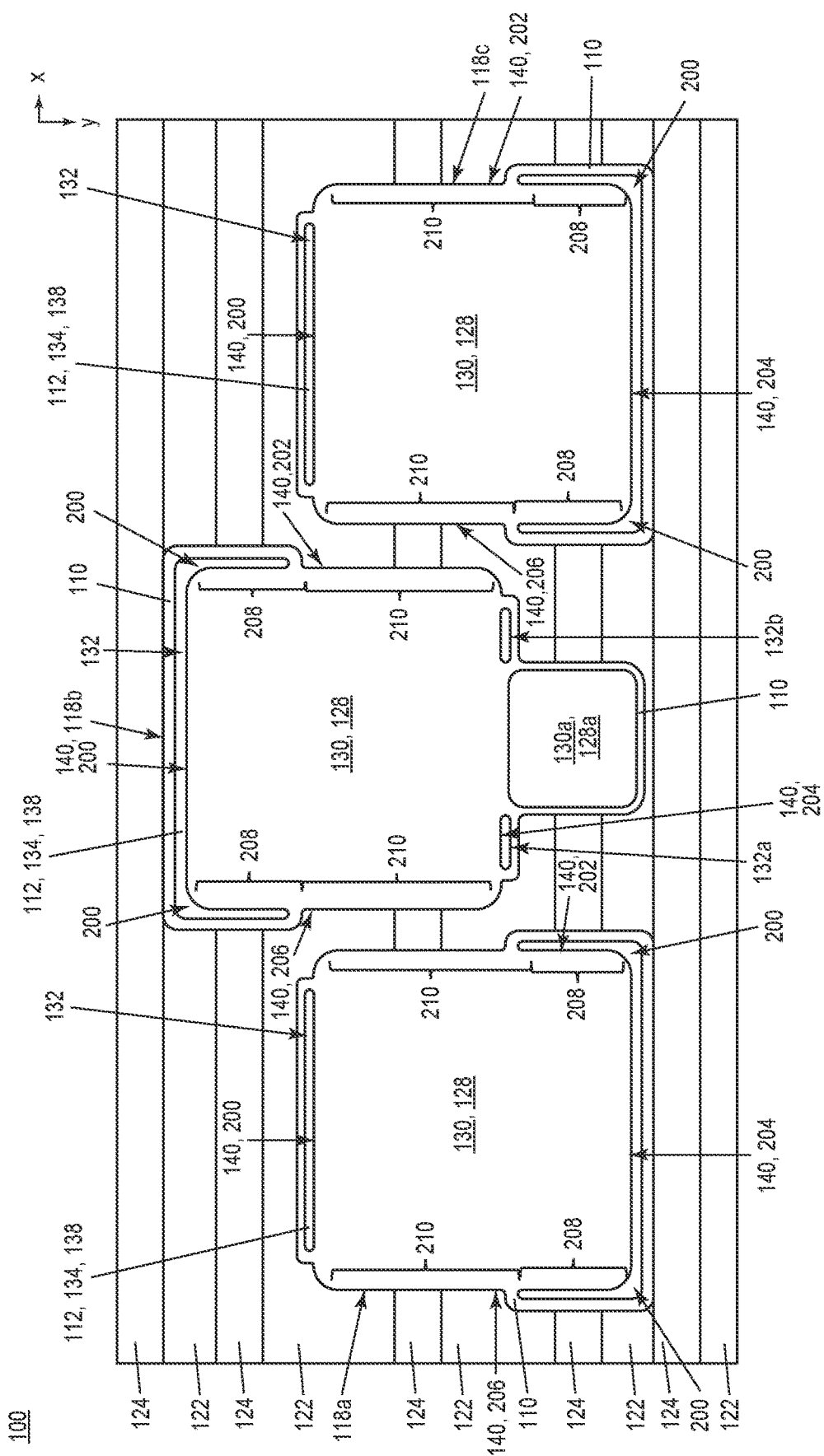
FIG. 3 illustrates a top plan view of the semiconductor die in a region of three adjacent contact pad structures.

FIG. 3 illustrates a top plan view of the semiconductor die 100 in a region of three adjacent contact pad structures 118a, 118b, 118c. Along an entire first side of the metal contact pad 130/contact area 128 of the contact pad structures 118a, 118b, 118c shown in FIG. 3, the region 138 of the underlying metal layer 112 that is unobstructed by the bond pad metallization 110 via the groove 132 laterally juts out beyond the edge 140 of the metal contact pad 130/contact area 128 so as to be optically visible in the plan view of the semiconductor die 100. For the leftmost and rightmost contact pad structures 118a, 118c in FIG. 3, the first side in the illustrated example is the lower side 204 of the metal contact pad 130/contact area 128 in the figure. For the middle contact pad structure 118b in FIG. 3, the first side in the illustrated example is the upper side 200 of the metal contact pad 130/contact area 128 in the figure.

Along part but not all of a second side of the metal contact pad 130/contact area 128 of the contact pad structures 118a, 118b, 118c shown in FIG. 3, the region 138 of the metal layer 112 that is unobstructed by the bond pad metallization 110 via the groove 132 juts out beyond the edge 140 of the metal contact pad 130/contact area 128 so as to be optically visible in the plan view of the semiconductor die 100. For the leftmost and rightmost contact pad structures 118a, 118c in FIG. 3, the second side can be considered any of the upper side 200, the right side 202, or the left side 206 of the metal contact pad 130/contact area 128 in the illustrated example. For the middle contact pad structure 118b in FIG. 3, the second side can be considered any of the right side 202, the lower side 204, or the left side 206 of the metal contact pad 130/contact area 128 in the illustrated example.

The 'first side' and the 'second side' of the metal contact pad 130/contact area 128 described above may meet in a corner region 200 of the metal contact pad 130/contact area 128. In this case, the groove 132 may extend uninterrupted from the first side to the second side around the corner region 200. According to this embodiment, the region 138 of the metal layer 112 that is unobstructed by the bond pad metallization 110 laterally juts out beyond the edge 140 of the metal contact pad 130/contact area 128 along the corner region 200 such that the optical detection marker 134 extends uninterrupted from the first side to the second side around the corner region 200.

For the middle contact pad structure 118b in FIG. 3, the groove 132 is interrupted at least once along the lower side 204 of the metal contact pad 130/contact area 128 such that the groove 132 is divided into at least two segments 132a, 132b along the lower side 204. The underlying metal layer 112 of the middle contact pad structure 118b in FIG. 3 is covered by the bond pad metallization 110 along the lower side 204 of the metal contact pad 130/contact area 128 between the at least two segments 132a, 132b of the groove 132. According to this embodiment, the optical detection marker 134 is interrupted at least once along the lower side 204 of the metal contact pad 130/contact area 128 such that the optical detection marker 134 is divided into at least two segments 134a, 134b along the lower side 204. The middle contact pad structure 118b in FIG. 3 has an additional, smaller metal contact pad 130a extending from the lower side 204 of the metal contact pad 130/contact area 128. The additional metal contact pad 130a has a contact area 128a which may be used for testing, sensing, etc.

The sides of the metal contact pads 130/contact areas 128 of adjacent contact pad structures 118a, 118b, 118c and that face one another may partly overlap one another in a first horizontal direction. For example, the right side 202 of the leftmost contact pad structure 118a and the left side 206 of the middle contact pad structure 118b partly overlap one another in the x direction in FIG. 3. The left side 206 of the rightmost contact pad structure 118c and the right side 202 of the middle contact pad structure 118b also partly overlap one another in the x direction in FIG. 3. According to this embodiment, the groove 132 is omitted along the part of the facing sides of the metal contact pads 130/contact areas 128 that overlap one another in the first horizontal direction. Accordingly, the optical detection marker 134 is omitted along the part of the facing sides of the metal contact pads 130/contact areas 128 that overlap one another in the first horizontal direction.

Both the bond pad metallization 110 and the underlying metal layer 112 may jut out from the part 208 of the facing sides of adjacent metal contact pads 130/contact areas 128 that do not overlap one another in the first horizontal direction but not from the part 210 of the facing sides of the adjacent metal contact pads 130/contact areas 128 that do overlap one another in the first horizontal direction. According to this embodiment, the groove 132 exposes the underlying metal layer 112 from the bond pad metallization 110 along the first part 208 of the facing sides of the adjacent metal contact pads 130/contact areas 128 but not along the second part 210.

Figure 4A:
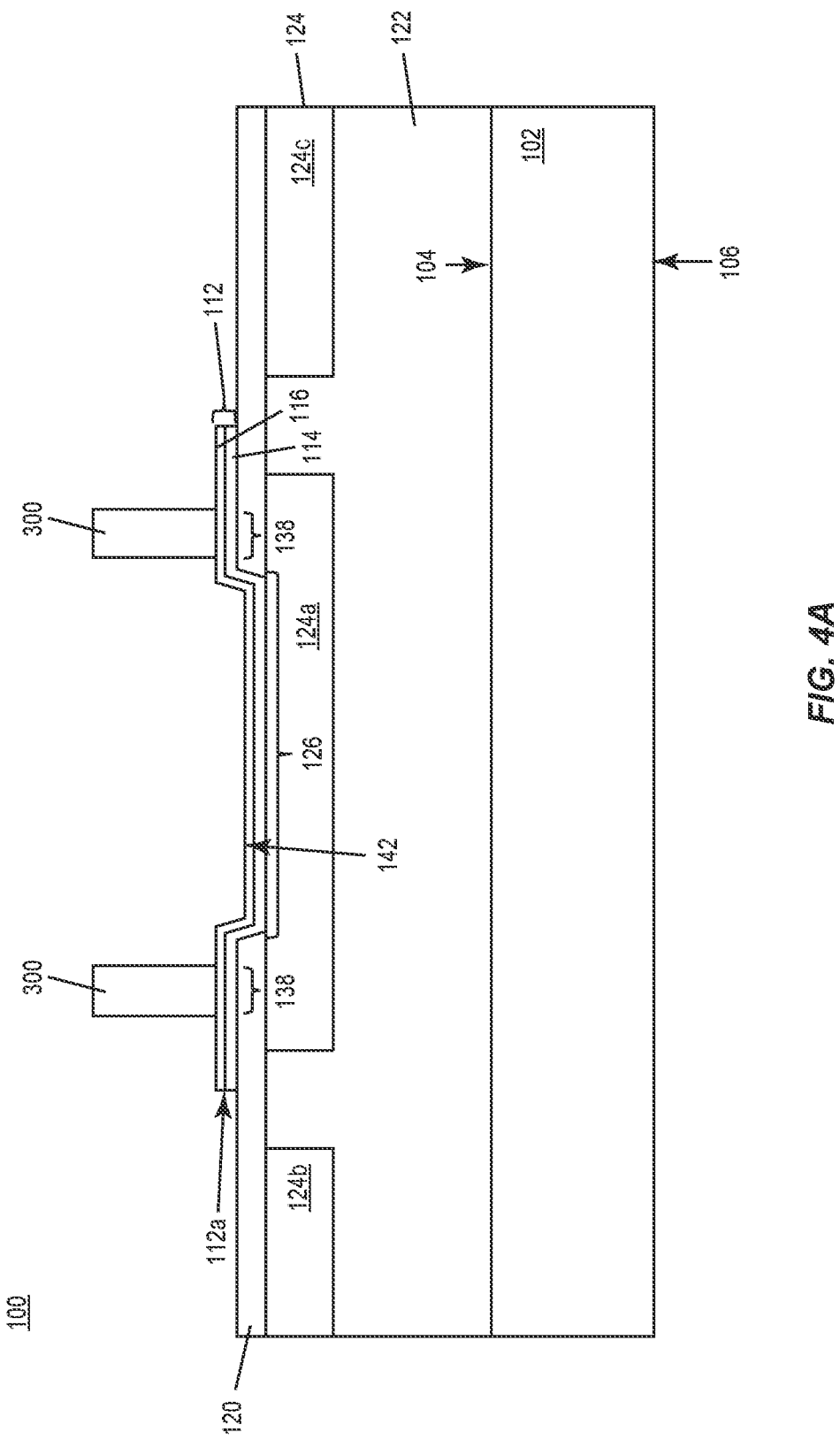
FIGS. 4A through 4C illustrate partial cross-sectional views of the semiconductor die during an embodiment of a method forming a groove that defines the optical detection marker.
Figure 4B:
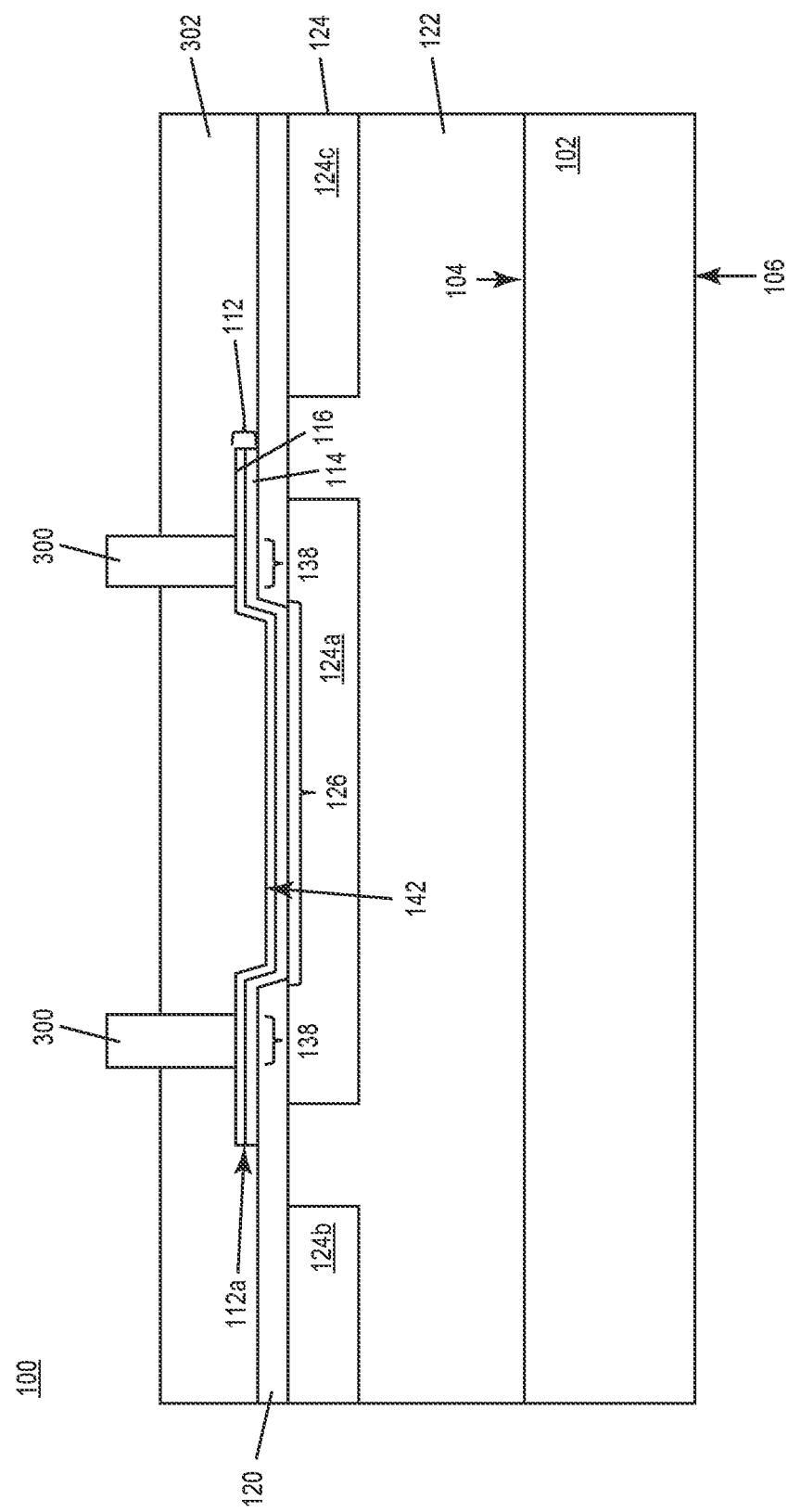
Figure 4C:
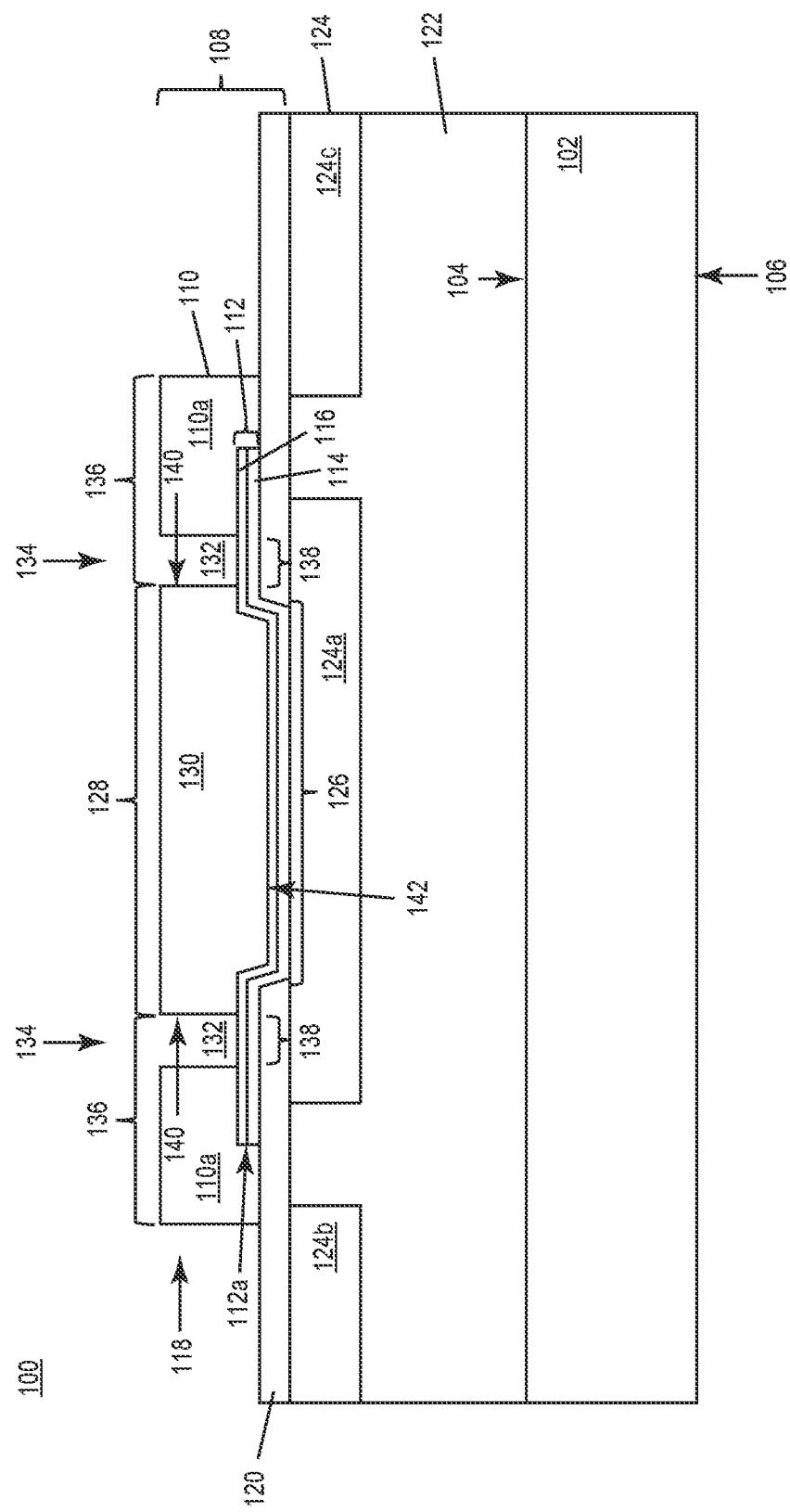

FIGS. 4A through 4C illustrate partial cross-sectional views of the semiconductor die 100 during an embodiment of a method of forming the groove 132 that defines the optical detection marker 134.

FIG. 4A shows the semiconductor die 100 after the underlying metal layer 112 of the final metallization stack 108 is formed. In FIGS. 4A through 4C, the underlying metal layer 112 is shown as a patterned barrier metallization formed on the last ILD 122. More generally, the metal layer 112 may be any intermediary metal layer interposed between the bond pad metallization 110 and the corresponding barrier metallization of the final metallization stack 108 or may be made of a non-metal material. The metal layer 112 is illustrated as a TiN barrier 114 and a Ti adhesion promoter 116 on the TiN barrier 114. As explained previously herein, the Ti adhesion promoter 116 may be omitted or a different barrier metallization system may be used, e.g., TiW in the case of Cu as the bond pad metallization 110. Still other metals and/or metal alloys may be used for the underlying metal layer 112 so long as the underlying metal layer 112 has a different contrast than the bond pad metallization 110.

FIG. 4A also shows a mask 300 such as a photoresist, polymer, imide, solder mask, etc. formed on the underlying metal layer 112 of the final metallization stack 108. The mask 300 prevents deposition of the bond pad metallization 110 in the region of the contact pad structure 118 where the mask 300 is present. As such, the mask 300 defines the location of the groove 132 to be formed in the bond pad metallization 110 of the final metallization stack 108. Accordingly, the mask 300 also defines the location of the region 138 of the underlying metal layer 112 that will be unobstructed by the metal contact pad 130 and form the optical detection marker 134 that is optically visible in a plan view of the semiconductor die 100.

FIG. 4B shows the semiconductor die 100 after blanket deposition of a metallization 302 that forms the bond pad metallization 110 of the final metallization stack 108. The metallization 302 is deposited with the mask 300 in place on the underlying metal layer 112, to prevent the metallization 302 from being deposited where the groove 132 is to be located. The metallization 302 may comprise Al, AlCu, AlSiCu, Cu, etc. and may have a plating such as Au, for example.

FIG. 4C shows the semiconductor die 100 after the mask 300 is removed and the metallization 302 patterned to form the bond pad metallization 110 of the final metallization stack 108. The patterning of the bond pad metallization 110 of the final metallization stack 108 may be implemented by the mask 300 outside the region that defines the location of the groove 132. The groove 132 is defined by removing the mask 300. The groove 132 ensures a region 138 of the underlying metal layer 112 is unobstructed by the bond pad metallization 110, including the metal contact pad 130, to form the optical detection marker 134 which is optically visible in a plan view of the semiconductor die 100.

Although the present disclosure is not so limited, the following numbered examples demonstrate one or more aspects of the disclosure.

Example 1. A semiconductor die, comprising: a semiconductor substrate; a first contact pad structure above the semiconductor substrate, the first contact pad structure comprising a metal contact pad configured for electrical contact and a metal layer adjoining an underside of the metal contact pad and jutting out beyond an edge of the metal contact pad; and a first optical detection marker in a periphery of the first contact pad structure and having a different contrast than the metal contact pad, wherein the first optical detection marker comprises a region of the metal layer that is adjacent to the edge of the metal contact pad and unobstructed by the metal contact pad so as to be optically visible in a plan view of the semiconductor die.

Example 2. The semiconductor die of example 1, wherein the metal contact pad has four sides that define the edge of the metal contact pad, and wherein along at least part of all four sides of the metal contact pad, the region of the metal layer that is unobstructed by the metal contact pad juts out beyond the edge of the metal contact pad so as to be optically visible in the plan view of the semiconductor die.

Example 3. The semiconductor die of example 1 or 2, wherein along an entire first side of the metal contact pad, the region of the metal layer that is unobstructed by the metal contact pad juts out beyond the edge of the metal contact pad so as to be optically visible in the plan view of the semiconductor die, and wherein along part but not all of a second side of the metal contact pad, the region of the metal layer that is unobstructed by the metal contact pad juts out beyond the edge of the metal contact pad so as to be optically visible in the plan view of the semiconductor die.

Example 4. The semiconductor die of example 3, wherein the first side and the second side of the metal contact pad meet in a corner region of the metal contact pad, wherein the region of the metal layer that is unobstructed by the metal contact pad juts out beyond the edge of the metal contact pad along the corner region, and wherein the first optical detection marker extends uninterrupted from the first side to the second side around the corner region.

Example 5. The semiconductor die of any of examples 1 through 4, wherein the first optical detection marker is interrupted at least once along a first side of the metal contact pad such that the first optical detection marker is divided into at least two segments along the first side.

Example 6. The semiconductor die of any of examples 1 through 5, wherein the metal contact pad comprises Au, wherein the metal layer comprises TiN, and wherein the TiN is unobstructed by the Au and optically visible in the plan view of the semiconductor die in the region adjacent the edge of the metal contact pad to form the first optical detection marker.

Example 7. The semiconductor die of any of examples 1 through 6, further comprising: a second contact pad structure above the semiconductor substrate, the second contact pad structure comprising a metal contact pad configured for electrical contact and a metal layer adjoining an underside of the metal contact pad of the second contact pad structure and jutting out beyond an edge of the metal contact pad of the second contact pad structure; and a second optical detection marker in a periphery of the second contact pad structure and having a different contrast than the metal contact pad of the second contact pad structure, wherein the second optical detection marker comprises a region of the metal layer of the second contact pad structure that is adjacent the edge of the metal contact pad of the second contact pad structure and unobstructed by the metal contact pad of the second contact pad structure so as to be optically visible in the plan view of the semiconductor die.

Example 8. The semiconductor die of example 7, wherein a first side of the first contact pad structure and a first side of the second contact pad structure face one another and partly overlap one another in a first horizontal direction, wherein the first optical detection marker is omitted along the part of the first side of the first contact pad structure that overlaps the first side of the second contact pad structure in the first horizontal direction, and wherein the second optical detection marker is omitted along the part of the first side of the second contact pad structure that overlaps the first side of the first contact pad structure in the first horizontal direction.

Example 9. A semiconductor die, comprising: a semiconductor substrate; an interlayer dielectric above the semiconductor substrate; a patterned metallization in the interlayer dielectric; a passivation covering the interlayer dielectric and the patterned metallization; a first contact pad structure on the passivation and extending through a first opening in the passivation to contact a first part of the patterned metallization, the first contact pad structure comprising a first bond pad metallization that has a first contact area and a first barrier metallization below the first bond pad metallization, the first barrier metallization having a different contrast than the first bond pad metallization; and a first groove extending through the first bond pad metallization outside the first contact area and exposing the first barrier metallization from the first bond pad metallization.

Example 10. The semiconductor die of example 9, wherein the first contact area has four sides that define an edge of the first contact area, and wherein the groove exposes the first barrier metallization from the first bond pad metallization along at least part of all four sides of the first contact area.

Example 11. The semiconductor die of example 9 or 10, wherein the groove exposes the first barrier metallization from the first bond pad metallization outside the first contact area along an entire first side of the first contact area, and wherein the groove exposes the first barrier metallization from the first bond pad metallization outside the first contact area along part but not all of a second side of the first contact area.

Example 12. The semiconductor die of example 11, wherein the first side and the second side of the first contact area meet in a corner region of the first contact area, and wherein the groove extends uninterrupted from the first side to the second side around the corner region.

Example 13. The semiconductor die of any of examples 9 through 12, wherein both the first barrier metallization and the first bond pad metallization jut out from a first part of a first side of the first contact area but not from a second part of the first side, and wherein the groove exposes the first barrier metallization from the first bond pad metallization along the first part of the first side but not along the second part.

Example 14. The semiconductor die of any of examples 9 through 13, wherein the groove is interrupted at least once along a first side of the first contact area such that the groove is divided into at least two segments along the first side, and wherein the first barrier metallization is covered by the first bond pad metallization along the first side between the at least two segments of the groove.

Example 15. The semiconductor die of any of examples 9 through 14, wherein beyond the groove, the first bond pad metallization covers an edge of the barrier metallization.

Example 16. The semiconductor die of any of examples 9 through 15, wherein the first bond pad metallization comprises Au, wherein the first barrier metallization comprises TiN, and wherein the groove exposes the TiN from the Au.

Example 17. The semiconductor die of any of examples 9 through 16, further comprising: a second contact pad structure on the passivation and extending through a second opening in the passivation to contact a second part of the patterned metallization, the second contact pad structure comprising a second bond pad metallization that has a second contact area and a second barrier metallization below the second bond pad metallization, the second barrier metallization having a different contrast than the second bond pad metallization; and a second groove extending through the second bond pad metallization of the second contact pad structure outside the second contact area and exposing the second barrier metallization from the second bond pad metallization.

Example 18. The semiconductor die of example 17, wherein a first side of the first contact area and a first side of the second contact area face one another and partly overlap one another in a first horizontal direction, wherein the first groove is omitted along the part of the first side of the first contact area that overlaps the first side of the second contact area in the first horizontal direction, and wherein the second groove is omitted along the part of the first side of the second contact area that overlaps the first side of the first contact area in the first horizontal direction.

Example 19. A method of producing a semiconductor die, the method comprising: forming a patterned metallization in an interlayer dielectric above a semiconductor substrate; covering the interlayer dielectric and the patterned metallization with a passivation; forming a contact pad structure on the passivation and extending through an opening in the passivation to contact a first part of the patterned metallization, the contact pad structure comprising a bond pad metallization that has a contact area and a barrier metallization below the bond pad metallization, the barrier metallization having a different contrast than the bond pad metallization; and forming a groove that extends through the bond pad metallization outside the contact area and exposes the barrier metallization from the bond pad metallization.

Example 20. The method of example 19, wherein forming the groove comprises: forming a mask on the barrier metallization, the mask defining a location of the groove; with the mask on the barrier metallization, depositing the bond pad metallization on the barrier metallization; and after depositing the bond pad metallization, removing the mask.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor die, comprising:
   a semiconductor substrate;
   a first contact pad structure above the semiconductor substrate, the first contact pad structure comprising a metal contact pad configured for electrical contact and a metal layer adjoining an underside of the metal contact pad and jutting out beyond an edge of the metal contact pad; and a first optical detection marker in a periphery of the first contact pad structure and having a different contrast than the metal contact pad, wherein the first optical detection marker comprises a region of the metal layer that is adjacent to the edge of the metal contact pad and unobstructed by the metal contact pad so as to be optically visible in a plan view of the semiconductor die.

2. The semiconductor die of claim 1, wherein the metal contact pad has four sides that define the edge of the metal contact pad, and wherein along at least part of all four sides of the metal contact pad, the region of the metal layer that is unobstructed by the metal contact pad juts out beyond the edge of the metal contact pad so as to be optically visible in the plan view of the semiconductor die.

3. The semiconductor die of claim 1, wherein along an entire first side of the metal contact pad, the region of the metal layer that is unobstructed by the metal contact pad juts out beyond the edge of the metal contact pad so as to be optically visible in the plan view of the semiconductor die, and wherein along part but not all of a second side of the metal contact pad, the region of the metal layer that is unobstructed by the metal contact pad juts out beyond the edge of the metal contact pad so as to be optically visible in the plan view of the semiconductor die.

4. The semiconductor die of claim 3, wherein the first side and the second side of the metal contact pad meet in a corner region of the metal contact pad, wherein the region of the metal layer that is unobstructed by the metal contact pad juts out beyond the edge of the metal contact pad along the corner region, and wherein the first optical detection marker extends uninterrupted from the first side to the second side around the corner region.

5. The semiconductor die of claim 1, wherein the first optical detection marker is interrupted at least once along a first side of the metal contact pad such that the first optical detection marker is divided into at least two segments along the first side.

6. The semiconductor die of claim 1, wherein the metal contact pad comprises Au, wherein the metal layer comprises TiN, and wherein the TiN is unobstructed by the Au and optically visible in the plan view of the semiconductor die in the region adjacent the edge of the metal contact pad to form the first optical detection marker.

7. The semiconductor die of claim 1, further comprising:
a second contact pad structure above the semiconductor substrate, the second contact pad structure comprising a metal contact pad configured for electrical contact and a metal layer adjoining an underside of the metal contact pad of the second contact pad structure and jutting out beyond an edge of the metal contact pad of the second contact pad structure; and
a second optical detection marker in a periphery of the second contact pad structure and having a different contrast than the metal contact pad of the second contact pad structure,
wherein the second optical detection marker comprises a region of the metal layer of the second contact pad structure that is adjacent the edge of the metal contact pad of the second contact pad structure and unobstructed by the metal contact pad of the second contact pad structure so as to be optically visible in the plan view of the semiconductor die.

8. The semiconductor die of claim 7, wherein a first side of the first contact pad structure and a first side of the second contact pad structure face one another and partly overlap one another in a first horizontal direction, wherein the first optical detection marker is omitted along the part of the first side of the first contact pad structure that overlaps the first side of the second contact pad structure in the first horizontal direction, and wherein the second optical detection marker is omitted along the part of the first side of the second contact pad structure that overlaps the first side of the first contact pad structure in the first horizontal direction.

9. A semiconductor die, comprising:
a semiconductor substrate;
an interlayer dielectric above the semiconductor substrate;
a patterned metallization in the interlayer dielectric;
a passivation covering the interlayer dielectric and the patterned metallization;
a first contact pad structure on the passivation and extending through a first opening in the passivation to contact a first part of the patterned metallization, the first contact pad structure comprising a first bond pad metallization that has a first contact area and a first barrier metallization below the first bond pad metallization, the first barrier metallization having a different contrast than the first bond pad metallization; and
a first groove extending through the first bond pad metallization outside the first contact area and exposing the first barrier metallization from the first bond pad metallization.

10. The semiconductor die of claim 9, wherein the first contact area has four sides that define an edge of the first contact area, and wherein the groove exposes the first barrier metallization from the first bond pad metallization along at least part of all four sides of the first contact area.

11. The semiconductor die of claim 9, wherein the groove exposes the first barrier metallization from the first bond pad metallization outside the first contact area along an entire first side of the first contact area, and wherein the groove exposes the first barrier metallization from the first bond pad metallization outside the first contact area along part but not all of a second side of the first contact area.

12. The semiconductor die of claim 11, wherein the first side and the second side of the first contact area meet in a corner region of the first contact area, and wherein the groove extends uninterrupted from the first side to the second side around the corner region.

13. The semiconductor die of claim 9, wherein both the first barrier metallization and the first bond pad metallization jut out from a first part of a first side of the first contact area but not from a second part of the first side, and wherein the groove exposes the first barrier metallization from the first bond pad metallization along the first part of the first side but not along the second part.

14. The semiconductor die of claim 9, wherein the groove is interrupted at least once along a first side of the first contact area such that the groove is divided into at least two segments along the first side, and wherein the first barrier metallization is covered by the first bond pad metallization along the first side between the at least two segments of the groove.

15. The semiconductor die of claim 9, wherein beyond the groove, the first bond pad metallization covers an edge of the barrier metallization.

16. The semiconductor die of claim 9, wherein the first bond pad metallization comprises Au, wherein the first barrier metallization comprises TiN, and wherein the groove exposes the TiN from the Au.

17. The semiconductor die of claim 9, further comprising:
a second contact pad structure on the passivation and extending through a second opening in the passivation to contact a second part of the patterned metallization, the second contact pad structure comprising a second bond pad metallization that has a second contact area and a second barrier metallization below the second bond pad metallization, the second barrier metallization having a different contrast than the second bond pad metallization; and
a second groove extending through the second bond pad metallization of the second contact pad structure outside the second contact area and exposing the second barrier metallization from the second bond pad metallization.

18. The semiconductor die of claim 17, wherein a first side of the first contact area and a first side of the second contact area face one another and partly overlap one another in a first horizontal direction, wherein the first groove is omitted along the part of the first side of the first contact area that overlaps the first side of the second contact area in the first horizontal direction, and wherein the second groove is omitted along the part of the first side of the second contact area that overlaps the first side of the first contact area in the first horizontal direction.

19. A method of producing a semiconductor die, the method comprising:
forming a patterned metallization in an interlayer dielectric above a semiconductor substrate;
covering the interlayer dielectric and the patterned metallization with a passivation;
forming a contact pad structure on the passivation and extending through an opening in the passivation to contact a first part of the patterned metallization, the contact pad structure comprising a bond pad metallization that has a contact area and a barrier metallization below the bond pad metallization, the barrier metallization having a different contrast than the bond pad metallization; and
forming a groove that extends through the bond pad metallization outside the contact area and exposes the barrier metallization from the bond pad metallization.

20. The method of claim 19, wherein forming the groove comprises:
forming a mask on the barrier metallization, the mask defining a location of the groove;
with the mask on the barrier metallization, depositing the bond pad metallization on the barrier metallization; and
after depositing the bond pad metallization, removing the mask.

* * * * *